(12) United States Patent
Kumar et al.

(10) Patent No.: US 12,272,424 B2
(45) Date of Patent: Apr. 8, 2025

(54) REDUCING SPURIOUS WRITE OPERATIONS IN A MEMORY DEVICE

(71) Applicant: Synopsys, Inc., Sunnyvale, CA (US)

(72) Inventors: Shishir Kumar, Noida (IN); Vinay Kumar, Aligarh (IN)

(73) Assignee: Synopsys, Inc., Sunnyvale, CA (US)

( * ) Notice: Subject to any disclaimer, the term of this patent is extended or adjusted under 35 U.S.C. 154(b) by 160 days.

(21) Appl. No.: 18/124,489

(22) Filed: Mar. 21, 2023

(65) Prior Publication Data

US 2023/0307019 A1 Sep. 28, 2023

Related U.S. Application Data

(60) Provisional application No. 63/322,461, filed on Mar. 22, 2022.

(51) Int. Cl.
*G11C 7/10* (2006.01)
*G11C 11/40* (2006.01)

(52) U.S. Cl.
CPC .......... *G11C 7/1084* (2013.01); *G11C 7/1096* (2013.01); *G11C 11/40* (2013.01)

(58) Field of Classification Search
CPC ....... G11C 7/1084; G11C 7/1096; G11C 7/12; G11C 11/40; G11C 11/4096
See application file for complete search history.

(56) References Cited

U.S. PATENT DOCUMENTS

| | | | | |
|---|---|---|---|---|
| 8,325,512 | B2 * | 12/2012 | Chuang | G11C 11/413 |
| | | | | 365/189.11 |
| 8,634,232 | B2 * | 1/2014 | Oh | G11C 8/08 |
| | | | | 365/158 |
| 9,865,337 | B1 * | 1/2018 | Ahmed | G11C 7/12 |
| 9,916,892 | B1 * | 3/2018 | Raj | G11C 11/419 |

* cited by examiner

*Primary Examiner* — Vanthu T Nguyen
(74) *Attorney, Agent, or Firm* — Patterson + Sheridan, LLP

(57) ABSTRACT

A memory device includes bitcells connected to wordlines and bitlines, and driver circuitry that updates the bitcells. The driver circuitry includes first transistors, and a first inverter device. The first transistors drive a bitcell of a memory device. The first inverter device is coupled to the first transistors, and drives the first transistors with a first control signal. The first inverter device includes first inverter circuitry and second inverter circuitry. The first inverter circuitry receives a first signal, a first voltage, and a second voltage differing from the first voltage, and generates a first inverted signal based on the first signal, the first voltage and the second voltage. The second inverter circuitry receives the first inverted signal, the second voltage and a third voltage differing from the second voltage, and generates the first control signal based on the first inverted signal, the third voltage and the second voltage.

17 Claims, 4 Drawing Sheets

REDUCING SPURIOUS WRITE OPERATIONS IN A MEMORY DEVICE

RELATED APPLICATION

This application claims the benefit of U.S. provisional patent application Ser. No. 63/322,461, filed Mar. 22, 2022, which is hereby incorporated herein by reference.

TECHNICAL FIELD

The present disclosure relates to driver circuitry for a memory device, and, more particularly, to driver circuitry for a memory device that includes inverter circuitry to reduce spurious write operations.

BACKGROUND

Memory devices include bitcells that use transistors to store data values. The memory devices further include driver circuitries that update the data values stored within the bitcells. The driver circuitry is connected to bitcells via bitlines. When updating a memory device, bitcells are selected, and the driver circuitry drives the bitlines associated with the selected bitcells with a voltage value. The driver circuitry may use a negative bitline technique to update the selected bitcells. In a negative bitline technique, the driver circuitry drives a negative voltage onto the selected bitcells. One bitcell may be updated at a time (e.g., written to), or the driver circuitry may perform a mask write operation where multiple bitcells are updated in a single operation.

SUMMARY

In one example, driver circuitry includes first transistors, and a first inverter device. The first transistors drive a bitcell of a memory device. The first inverter device is coupled to the first transistors, and drives the first transistors with a first control signal. The first inverter device includes first inverter circuitry and second inverter circuitry. The first inverter circuitry receives a first signal, a first voltage, and a second voltage differing from the first voltage, and generates a first inverted signal based on the first signal, the first voltage and the second voltage. The second inverter circuitry receives the first inverted signal, the second voltage and a third voltage differing from the second voltage, and generates the first control signal based on the first inverted signal, the third voltage and the second voltage.

In one example, a memory device includes bitcell circuitry and driver circuitry. The bitcell circuitry includes bitcells, wordlines, and bitlines. Each bitcell is connected to one of the wordlines and one or more of the bitlines. The driver circuitry includes first transistors and a first inverter device. The first transistors drive a first bitcell of the bitcells via a first bitline of the bitlines. The first inverter device is coupled to the first transistors and drives the first transistors with a first control signal. The first inverter device includes first inverter circuitry and second inverter circuitry. The first inverter circuitry receives a first signal, a first voltage, and a second voltage differing from the first voltage, and generates a first inverted signal based on the first signal, the first voltage and the second voltage. The second inverter circuitry receives the first inverted signal, the second voltage, and a third voltage differing from the second voltage, and generates the first control signal based on the first inverted signal, the third voltage and the second voltage.

In one example, driver circuitry includes a first inverter device and a second inverter device. The first device is coupled to first transistors, and drives the first transistors with a first control signal. The first inverter device includes first inverter circuitry and second inverter circuitry. The first inverter circuitry generates a first inverted signal based on the first signal, a first voltage and a second voltage. The second voltage differs from the first voltage. The second inverter circuitry generates a first control signal based on the first inverted signal, the third voltage and the second voltage. The third voltage differs from the second voltage. The first transistors drive a first bitcell of a memory device based on the first control signal. The second inverter device is coupled to second transistors and drives the second transistors with a second control signal generated based on a second signal. The second inverter device includes third inverter circuitry and fourth inverter circuitry. The third inverter circuitry generates a second inverted signal based on the second signal, the first voltage and the second voltage. The fourth inverter circuitry generates the second control signal based on the second inverted signal, the third voltage and the second voltage. The second transistors drive the first bitcell based on the second control signal.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to reducing spurious write operations in a memory device.

A memory device includes a plurality of bitcells that store values based on a voltage driven onto the transistors of the bitcells. The bitcells are disposed in a plurality of rows and columns. Bitcells in the same column are connected to each other via one or more bitlines. Bitcells in the same row are connected to each other via wordlines. In other examples, the bitcells may be arranged configurations different from rows and columns. By selecting a wordline and a bitline (or pair of bitlines), a specific bitcell is selected for updating. The memory device further includes driver circuitry. The driver circuitry is connected to the bitlines of the bitcells and is used to drive voltages onto the bitlines to update the selected bitcells.

The driver circuitry may use a negative bitline technique to update the selected bitcells. In a negative bitline technique, the driver circuitry drives a negative voltage onto the selected bitcells. However, during a write operation, where one or more bitcells are unselected for updating, an unselected bitcell may be erroneously updated. For example, an erroneous write may occur when the driver circuitry experiences a negative voltage spike. The negative voltage spike may turn on one or more transistors within the driver circuitry that drives an unselected bitcell or bitcells, resulting in an erroneous write, and a memory retention error.

In the following, driver circuitry is described that includes inverter devices that mitigate the effects of voltage spikes, mitigating memory retention errors. For example, the driver circuitry includes inverter devices, transistors forming a pre-driver circuitry, and write driver circuitry. The inverter devices includes multiple inverter circuitries. The pre-driver circuitry includes a first and second transistor that are respectively driven by different inverter circuitries. The inverter circuitries are driven by different ground supply signals than the pre-driver circuitry. Accordingly, when one of the first and second transistors is driven (e.g., turned-on) to update a bitcell, the other one of the first and second transistors is maintained in a turned-off state, mitigating erroneous writes from occurring.

Technical advantages of the present disclosure include, but are not limited to, driving the transistors with respective inverter circuitries to maintain the transistors in a turned-off state during a write mask operation (or other memory operation), mitigating erroneous writes from occurring, and mitigating memory retention errors within in a corresponding memory device.

Figure 1:
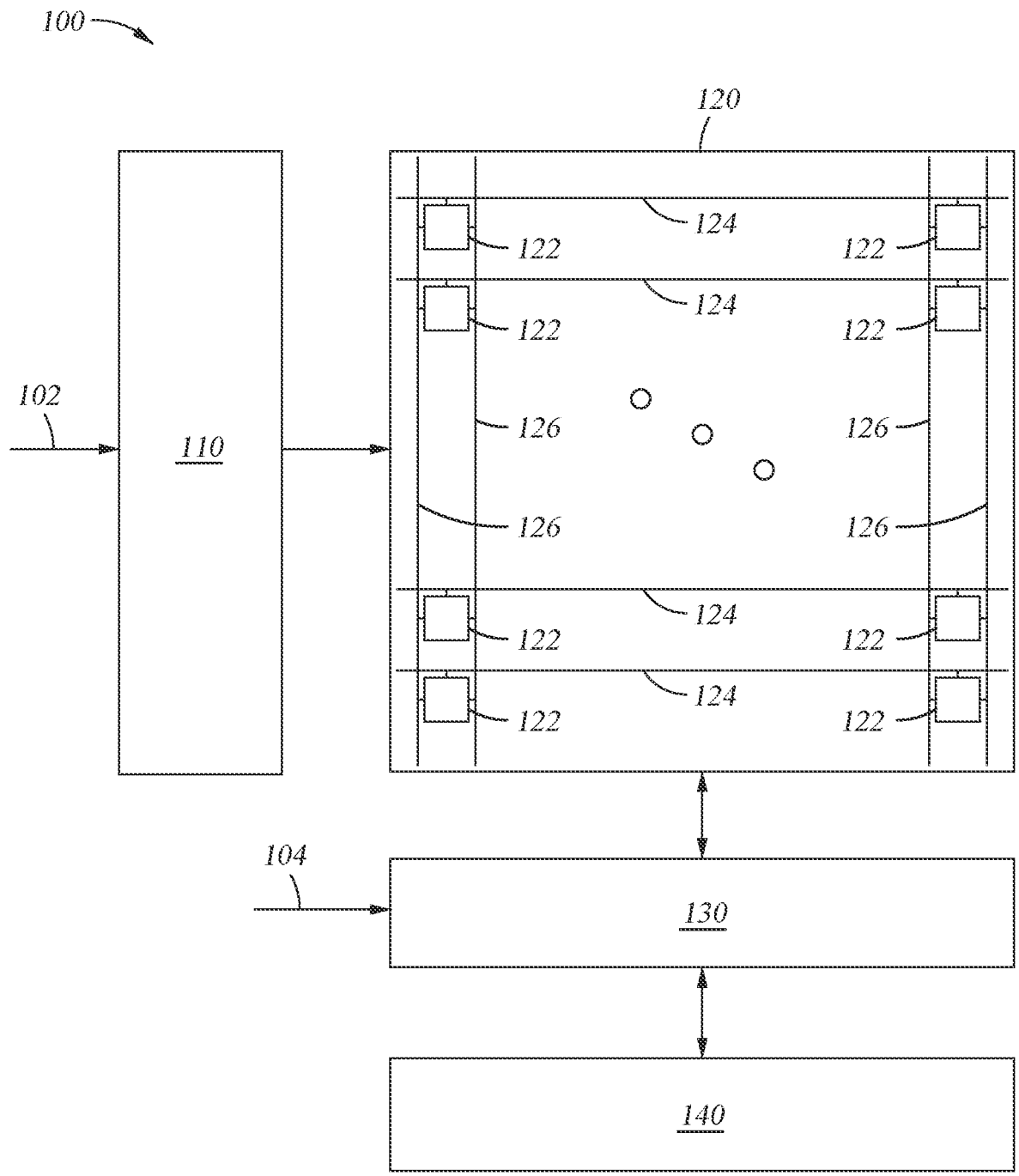
FIG. 1 illustrates block diagram of a memory device in accordance with some embodiments of the present disclosure.

FIG. 1 illustrates a block diagram of a memory device 100. The memory device 100 includes row decoder circuitry 110, bitcell array circuitry 120, column decoder circuitry 130, and driver circuitry 140. In other example, the memory device 100 may include other circuit elements. In one or more examples, the memory device 100 is a random access memory (RAM) device. The RAM device may be a bulk RAM device or a fin field-effect transistor (FinFET) RAM device, among others. In other examples, the memory device 100 is another type of memory.

The bitcell array circuitry 120 includes bitcells 122, wordlines 124, and bitlines 126. Each of the bitcells 122 is connected to one of the wordlines and two of the bitlines 126. In other examples, the bitcells 122 may be connected to other combinations of wordlines 124 and bitlines 126. The bitcells 122 are arranged in rows and columns. Each row corresponds to a wordline 124, and each column corresponds to two of the bitlines 126. In other examples, the bitcells 122 may be arranged in configurations other than rows and columns. A bitcell 122 is selected for updating by activating the respective wordline 124 and the respective bitlines 126.

The row decoder circuitry 110 is coupled to the wordlines 124. The row decoder circuitry 110 receives the control signal 102 and determines which wordline 124 is associated with the bitcell 122 selected for updating. The control signal 102 may be an address signal which indicates which of the bitcells 122 is to be updated. The row decoder circuitry 110 activates (e.g., drives) the wordline 124 associated with the selected bitcell 122. Activating a wordline 124 includes driving the wordline to a high or low voltage value.

The column decoder circuitry 130 is coupled to the bitlines 126. The column decoder circuitry 130 receives the control signal 104 and determines which bitlines 126 are associated with the bitcell 122 selected for updating. The control signal 104 may be an address signal which indicates which of the bitcells 122 is to be updated. The column decoder circuitry 130 selects the bitlines 126 associated with the selected bitcell 122. In one example, the column decoder circuitry 130 couples the selected bitlines 126 to the driver circuitry 140.

The driver circuitry 140 is coupled to the bitlines 126, and drives a data signal (e.g., voltage) onto the selected bitlines 126 to update values within the selected bitcells 122, performing a write operation. Further, the driver circuitry 140 receives a data signal (e.g., voltage) from selected bitlines 126 to perform a read operation. The driver circuitry 140 further performs a write mask operation. In a write mask operation, one or more bitcells are masked for writing based on the corresponding mask bit being set, and the other bitcells of the same word are written according to the data bus. In one example, the driver circuitry 140 drives the bitlines 126 using a negative bitline technique.

Figure 2:
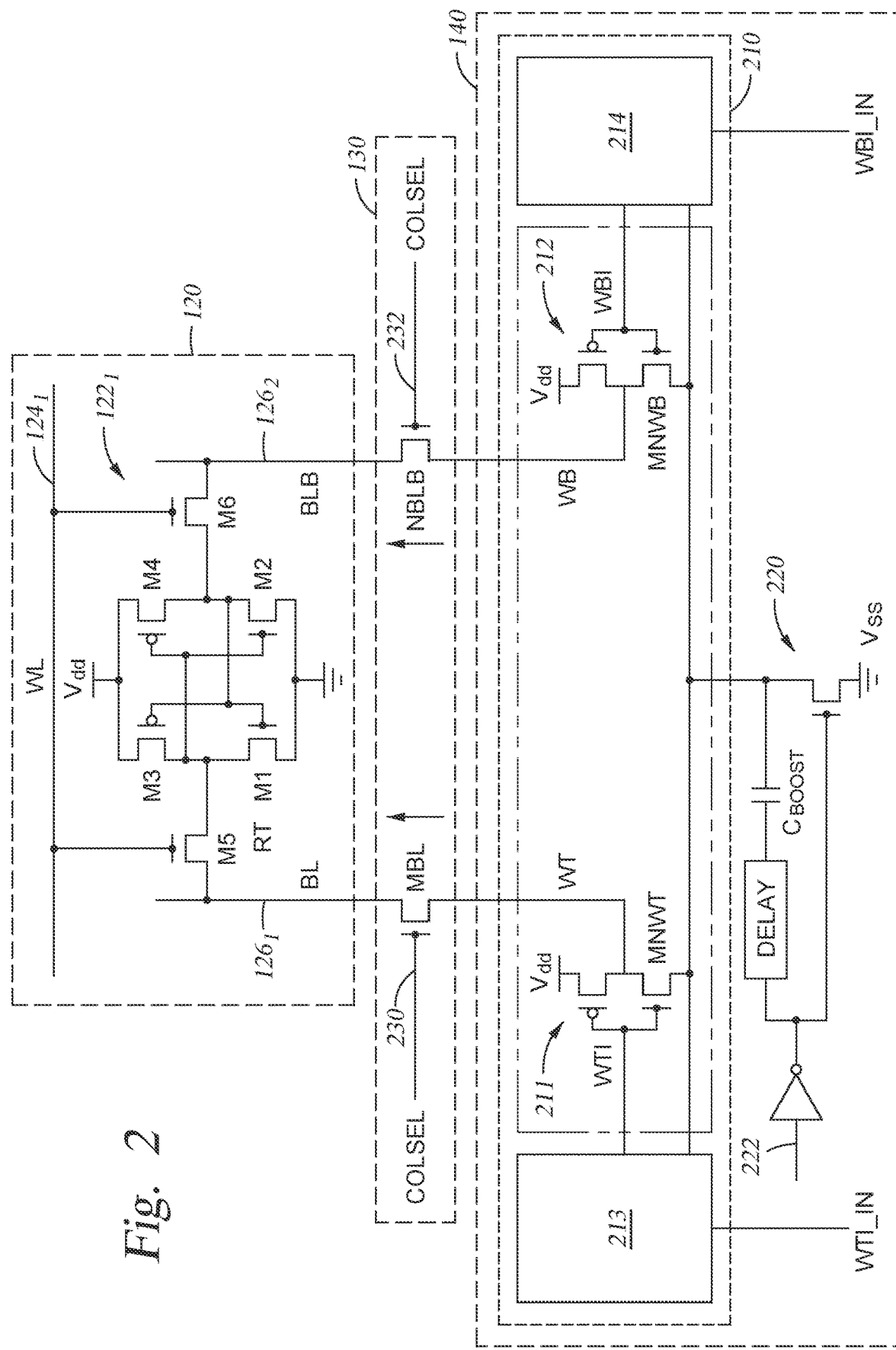
FIG. 2 illustrates a block diagram of a portion of a memory device in accordance with some embodiments of the present disclosure.

FIG. 2 is a schematic diagram of at least a portion of the bitcell array circuitry 120 and at least a portion of the driver circuitry 140, according to one or more examples. The driver circuitry 140 is connected to and is configured to drive the bitcell $122_1$ via bitlines $126_1$ (BL) and $126_2$ (BLB). The bitcell $122_1$ is further coupled to the wordlines $124_1$.

The bitcell $122_1$ includes one or more transistors that are updated with a voltage value corresponding to a data signal received by the driver circuitry 140. In the example of FIG. 2, the bitcell $122_1$ includes six transistors (e.g., transistors M1, M2, M3, M4, M5, and M6). In other examples, the bitcell $122_1$ includes more than or less than six transistors. One or more of the transistors (e.g., transistors M5 and M6) are coupled to the wordline $124_1$ and the bitlines $126_1$ and $126_2$, to activate the bitcell $122_1$ for updating. Further, one or more transistors of the bitcell $122_1$ (e.g., the transistors M1, M2, M3, and M4) are driven with the updated voltage value or a voltage value is read from the one or more transistors of the bitcell $122_1$.

The column decoder circuitry 130 includes column selection circuitry 230 and 232. The column selection circuitry 230 and 232 selects the bitcell $122_1$ for updating via the bitlines $126_1$ and $126_2$. In one example, the column selection circuitry 230 and 232 are transistors driven via the control signal colsel. In one example, driving the control signals colsel to a high voltage value (e.g., or a low voltage value) activates the bitlines $126_1$ and $126_2$ for updating.

The driver circuitry 140 includes write driver circuitry 210, transistors 211, 212 (e.g., pre-driver circuitry), inverter devices 213, 214, and voltage driver 220. The inverter device 213 is connected to the transistors 211 via node WTI. The transistors 211 are connected to the column selection circuitry 230 and the bitline $126_1$ via the node WT. The inverter device 214 is connected to the transistors 212 via node WBI. The transistors 212 are connected to the selection circuitry 232 and the bitline $126_2$ via the node WB.

The driver circuitry 140 drives the bitlines $126_1$ and $126_2$ to update one or more transistors (e.g., transistors M1, M2, M3 and M4) of the bitcell $122_1$. In one example, the driver circuitry 140 uses a negative bit line write assist technique to drive data on (e.g., update the voltage value of) the bitcell $122_1$. In a negative bit-line assist technique, the driver circuitry 140 drives a negative voltage onto the bitcell $122_1$ via the bitlines $126_1$ and $126_2$. The voltage driver 220 provides the negative voltage that is driven onto the bitcell $122_1$. The voltage driver 220 receives an input voltage signal 222 and generates the negative voltage.

However, when using a negative bit-line assist technique, errors may be introduced into bitcells of the corresponding memory device (e.g., the bitcells 122 of the memory device 100). For example, the negative voltage generated during a write operation (e.g., writing data to a single bitcell 122)

may create an unwanted write operation during a write mask operation due to the generation of a negative voltage from the voltage driver 220. The negative voltage may turn on one or more transistors of the transistors 211, 212, allowing for an erroneous write operation to occur.

In a write mask operation, a wordline 124 for the selected row is activated (e.g., the wordline $124_1$), while the write operation on a one or more bitcells 122 is masked. In one example, in a write mask operation a two or more bits of a data signal (e.g., a data signal input to driver circuitry 140) are masked.

In one or more examples, the write mask operation is implemented by driving the nodes WTI and WBI with a voltage signal of 0 V. The voltage on the bitlines $126_1$ and $126_2$ is held at a high value, e.g., maintained, to prevent unwanted writes to the bitcell $122_1$. In the mask write operation, a negative voltage driven by the voltage driver 220 across the write driver circuitry 210 may cause an erroneous write operation. For example, one or more of the transistors 211 and 212 is an n-type metal-oxide semiconductor (NMOS) transistor that may turn on in the presence of the negative voltage, and perform a write operation on an unselected bitcell, resulting in a retention error of the corresponding memory device (e.g., one or more of the bitcells 122 of the memory device 100 of FIG. 1). In one example, one or more of the transistors 211 or 212 of the write driver circuitry 210 have a threshold voltage of about 200 to 300 mV. Accordingly, large negative voltage spikes may erroneously turn on one or more of the transistors, and data is erroneously written to an unselected bitcell.

In the negative bit line write assist technique, the negative voltage dip is generated via a boost capacitor, e.g., $C_{boost}$ within the voltage driver 220. In one example, a negative voltage is transferred to either of the bitlines $126_1$, $126_2$ through transistors 211, 212 depending on whether the operation is a Write "0" and Write "1" operation. In one example, the transistors 211 includes transistor MNWT and the transistors 212 includes transistors WNWB. In such an example, a negative voltage is transferred to either of the bitlines $126_1$, $126_2$ through transistors MNWT, MNWB depending on whether the operation is a Write "0" and Write "1" operation. The value of negative voltage varies with memory size, bitcell requirement, process, voltage, temperature, and extraction corner.

In one or more examples, the inverter device 213 and the inverter device 214 maintain a zero gate-source voltage (Vgs) across the transistors 211 and 212, respectively, maintaining the transistors 211 and 212 in the off position. In one example, inverter device 213 and the inverter device 214 maintain the Vgs across the transistors 211 and 212 below the threshold voltage (e.g., turn-on voltage), preventing erroneous writes to the bitcell $122_1$.

As will be explained in further detail in the following, the inverter device 213 includes two inverters that are connected to different voltage rails (e.g., different voltage signals). Further, the inverter device 214 includes two inverters that are connected to different voltage rails (e.g., different voltage signals). The inverter devices 213 and 214 maintain the voltage of the word drive gate signals WTI and WBI at the voltage of VSS_WA to maintain a zero Vgs across the transistors 211 and 213, mitigating erroneous writes from occurring.

Figure 3:
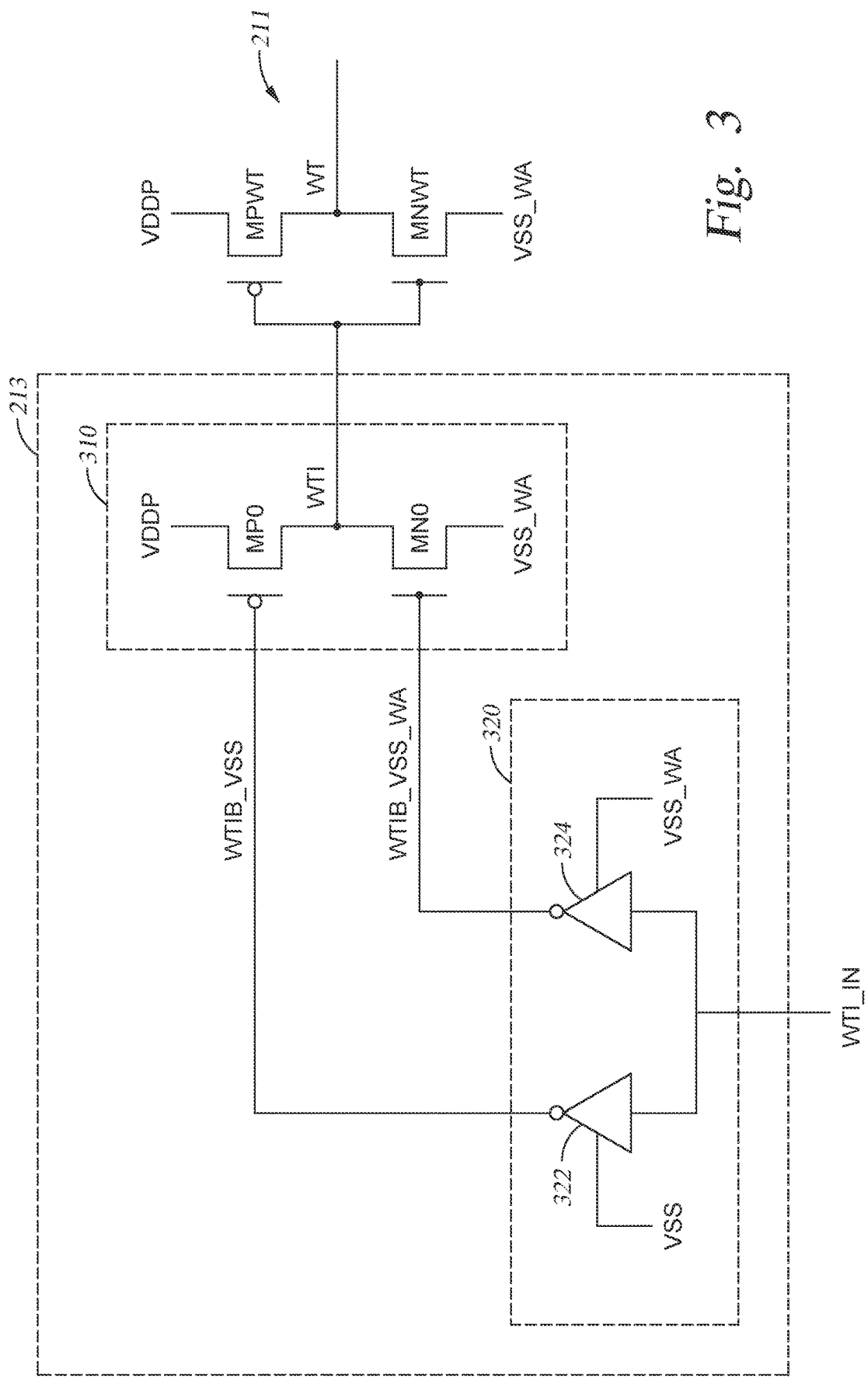
FIG. 3 illustrates a block diagram of an inverter device in accordance with some embodiments of the present disclosure.

FIG. 3 illustrates a schematic circuit design of the inverter device 213, according to one or more examples. The inverter device 213 includes inverter circuitry 310 and inverter circuitry 320. The inverter circuitry 310 is connected to a node that receives the reference voltage signal VDDP and a node that receives the reference voltage signal VSS_WA. The inverter circuitry 320 is connected to a node that receives the voltage signal VSS and a node that receives the voltage signal VSS_WA. VSS is a ground signal. A voltage value of VDDP is greater than a voltage value of VSS. Further, a voltage value of VSS_WA is less than or equal to a voltage value of VSS.

An input node of the inverter circuitry 320 receives the control signal WTI_IN (e.g., a write signal). The inverter circuitry 320 inverts the control signal WTI_IN and provides the inverted signal to the inverter circuitry 310. The inverter circuitry 320 includes inverter 322 and inverter 324. The inverter 322 receives the control signal WTI_IN and VSS. The inverter 322 generates the inverted control signal WTIB_VSS by inverting the control signal WTI_IN based on VSS. The inverter 324 receives the control signal WTI_IN and VSS_WA. The inverter 324 generates the inverted control signal WTIB_VSS_WA by inverting the control signal WTI_IN based on VSS_WA.

The inverter circuitry 310 inverts the inverted control signal (e.g., WTIB_VSS or WTIB_VSS_WA) to generate the gate signal on the node WTI. The gate signal at the node WTI is output to the gate nodes of the transistors MPWT and MNWT of the transistors 211.

The inverter circuitry 310 includes transistors MP0 and MN0. The transistor MP0 is a p-type metal-oxide semiconductor (PMOS) transistor. The transistor MN0 is a NMOS transistor. A gate of the transistor MP0 is connected to the output of the inverter circuitry 320 and receives the inverted control signal WTIB_VSS. A source of the transistor MP0 is connected to a node that receives VDDP. A drain of the transistor MP0 is connected to the node WTI. A gate of the transistor MN0 is connected to the output of the inverter circuitry 320 and receives the inverted control signal WTIB_VSS_WA. A drain of the transistor MN0 is connected to the drain of the transistor MP0 and the output node. A source of the transistor MN0 is connected to a node that receives the voltage VSS_WA.

Further, the transistor MPWT is a PMOS transistor and the transistor MNWT is an NMOS transistor. A gate of the transistor MPWT is connected to the node WTI, a source of the transistor MPWT is coupled to a node that receives VDDP, and drain of the transistor MPWT is coupled to the node WT that outputs a drive signal. A gate of the transistor MNWT is connected to the node WTI, a source of the transistor MNWT is coupled to a node that receives VSS_WA, and a drain of the transistor MNWT is coupled to the node WT.

Figure 4:
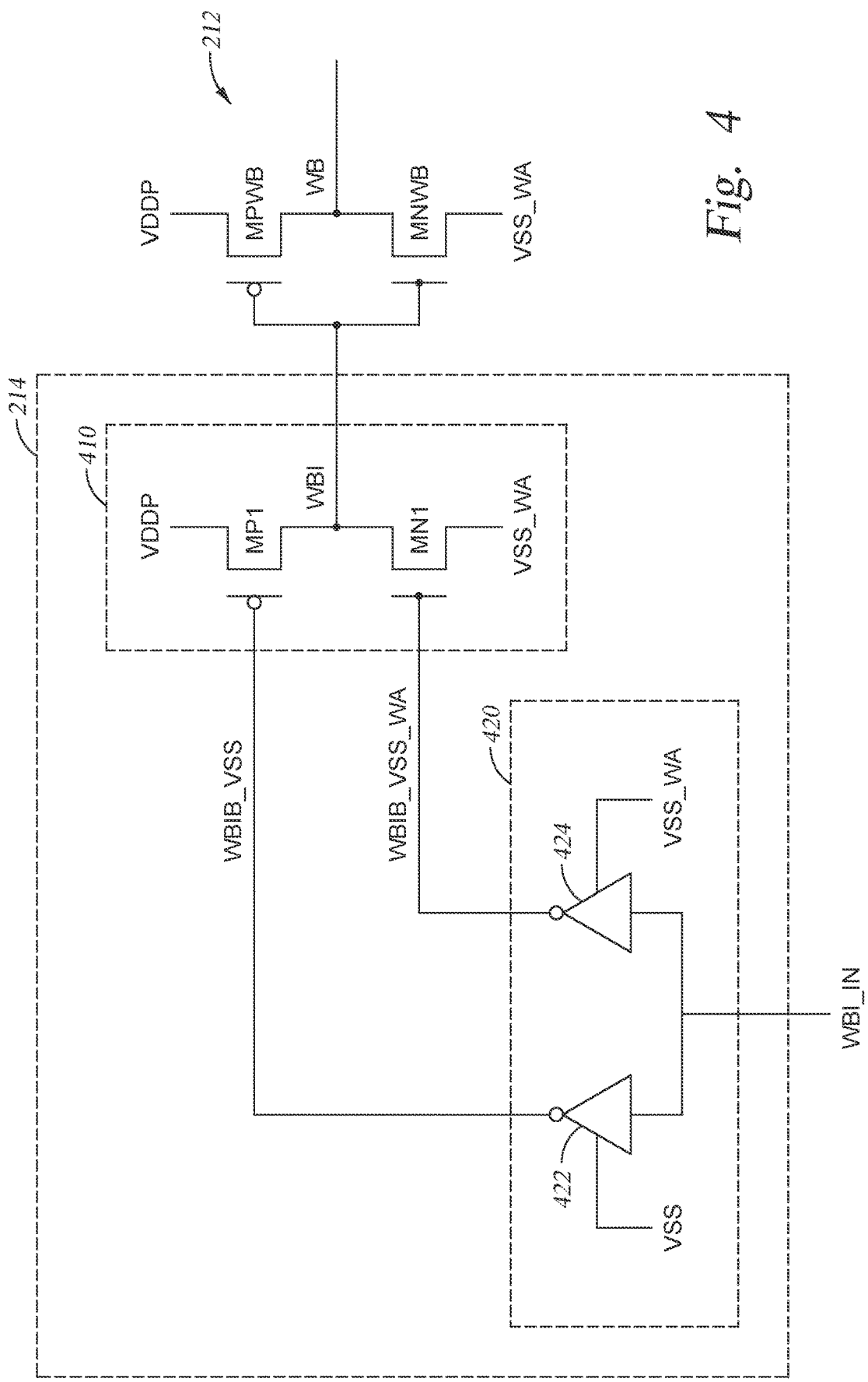
FIG. 4 illustrates a block diagram of an inverter device in accordance with some embodiments of the present disclosure.

FIG. 4 illustrates a schematic circuit design of the inverter device 214, according to one or more examples. The inverter device 214 includes inverter circuitry 410 and inverter circuitry 420. The inverter circuitry 410 is connected to a node that receives the reference voltage signal VDDP and a node that receives the reference voltage signal VSS_WA. The inverter circuitry 420 is connected to a node that receives the voltage signal VSS and a node that receives the voltage signal VSS_WA.

An input node of the inverter circuitry 420 receives the control signal WBI_IN (e.g., a write signal). The inverter circuitry 420 inverts the control signal WBI_IN and provides the inverted signal to the inverter circuitry 410. The inverter circuitry 420 includes inverter 422 and inverter 424. The inverter 422 receives the control signal WBI_IN and VSS. The inverter 422 generates the inverted control signal WBIB_VSS by inverting the control signal WBI_IN based on VSS. The inverter 424 receives the control signal WBI_IN and VSS_WA. The inverter 424 generates the inverted control signal WBIB_VSS_WA by inverting the control signal WBI_IN based on VSS_WA.

The inverter circuitry 410 inverts the inverted control signal (e.g., WBIB_VSS or WBIB_VSS_WA) to generate a signal on the node WBI. The gate signal on the node WBI is output to the gate nodes of the transistors MPWB and MNWB of the transistors 212.

The inverter circuitry 410 includes transistors MP1 and MN1. The transistor MP1 is PMOS transistor. The transistor MN1 is an NMOS transistor. A gate of the transistor MP1 is connected to the output of the inverter circuitry 420 and receives the inverted control signal WBIB_VSS. A source of the transistor MP1 is connected to a node that receives VDDP. A drain of the transistor MP1 is connected to the node WBI. A gate of the transistor MN1 is connected to the output of the inverter circuitry 420 and receives the inverted control signal WBIB_VSS_WA. A drain of the transistor MN1 is connected to the drain of the transistor MP1 and the output node. A source of the transistor MN1 is connected to a node that receives the voltage VSS_WA.

Further, the transistor MPWB is a PMOS transistor and the transistor MNWB is an NMOS transistor. A gate of the transistor MPWB is connected to the node WBI, a source of the transistor MPWB is coupled to a node that receives VDDP, and drain of the transistor MPWB is coupled to the node WB to output a drive signal. A gate of the transistor MNWB is connected to the output node that outputs the signal WBI, a source of the transistor MNWB is coupled to a node that receives VSS_WA, and a drain of the transistor MNWB is coupled to the node WB to output the drive signal.

With further reference to FIG. 2, in one or more examples, when the transistors 211 and 212 are in an off state and the voltage of VSS decreases (e.g., dips) the voltage on nodes WTI and WBI decreases, following the voltage of VSS, and maintaining the transistors 211 and 212 in an off state. Accordingly, the voltages on the internal nodes of the bitcell $122_1$ are unchanged, and mitigating write errors within the bitcell $122_1$.

In one example, during a write mask operation, WTI and WBI are driven to VSS_WA. Accordingly, the transistor MPWB of transistors 212 and transistor MPWT of transistors 211 are driven to an ON state, and transistor MNWB of transistors 212 and transistor MNWT of transistors 211 are driven to an OFF state. As transistors MNWB and MNWT are in an off state, no voltage dip occurs at on bitlines $126_1$ and $126_2$, mitigating undesired writes on the bitcell $122_1$.

In one or more examples, WBI_IN is at a logic 0 (e.g., a low voltage value), WBIB_VSS and the value of WBIB_VSS_WA are at a logic 1 (e.g., a high voltage value). In such an example, the inverter device 214 maintains WBI at a logic 0 (at VSS_WA). Maintaining WB at a logic 1 (at VDDP), mitigating write errors as the transistor MNWB is prevented from turning on when VSS_WA decreases.

In one or more examples, WTI_IN is at a logic 0 (e.g., a low voltage value), WTIB_VSS and the value of WTIB_VSS_WA are at a logic 1 (e.g., a high voltage value). In such an example, the inverter device 213 maintains WTI at a logic 0 (at VSS_WA). Maintaining WT at a logic 1 (at VDDP), mitigating write errors as the transistor MNWT is prevented from turning on when VSS_WA decreases.

In one example, driver circuitry 140 includes more than one write driver circuitry 210. For example, each row of the bitcells 122 (e.g., each pair of bitlines 126 of a row of bitcells) may be coupled to a different write driver circuitry 210. In one example, the driver circuitry 140 includes N write driver circuitries 210. N is greater than 1. In one example, N is greater than 10, greater than 100, or greater than 1000. Each of the write driver circuitry 210 functions similar and is configured similar to that as described above with regard to FIGS. 2, 3, and 4.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A driver circuitry comprising:
   first transistors configured to drive a bitcell of a memory device; and
   a first inverter device coupled to the first transistors, and configured to drive the first transistors with a first control signal, wherein the first inverter device comprises:
   first inverter circuitry configured to receive a first signal, a first voltage, and a second voltage differing from the first voltage, and generate a first inverted signal based on the first signal, the first voltage and the second voltage; and
   second inverter circuitry configured to receive the first inverted signal, the second voltage and a third voltage differing from the second voltage, and generate the first control signal based on the first inverted signal, the third voltage and the second voltage, wherein a voltage value of the third voltage is greater than a voltage value of the second voltage.

2. The driver circuitry of claim 1, wherein the second inverter circuitry comprises:
   a first transistor comprising a gate configured to receive the first inverted signal, a source configured to receive the third voltage, a drain configured to output the first control signal; and
   a second transistor comprising a gate configured to receive the first inverted signal, a drain connected to the drain of the first transistor and configured to output the first control signal, and a source configured to receive the second voltage.

3. The driver circuitry of claim 1 further comprising:
   second transistors configured to drive the bitcell; and
   a second inverter device coupled to the second transistors and configured to drive the second transistors with a second control signal generated based on a second signal.

4. The driver circuitry of claim 3, wherein the second inverter device comprises:
   third inverter circuitry configured to receive the second signal, the first voltage and the second voltage, and generate a second inverted signal based on the second signal, the first voltage and the second voltage; and
   fourth inverter circuitry configured to receive the second inverted signal, the third voltage, and the second voltage, and generate the second control signal based on the second inverted signal, the third voltage and the second voltage.

5. The driver circuitry of claim 4, wherein the fourth inverter circuitry comprises:
   a third transistor comprising a gate configured to receive the second inverted signal, a source configured to receive the third voltage, and a drain configured to output the second control signal; and a fourth transistor comprising a gate configured to receive the second inverted signal, a drain connected the drain of the third transistor and configured to output the second control signal, and a source configured to receive the second voltage.

6. The driver circuitry of claim 1, wherein the first control signal is maintained at a logic value of zero based on the first signal having a logic value of zero.

7. The driver circuitry of claim 1, wherein the first transistors comprise:
a first transistor comprising a gate configured to receive the first control signal, a source configured to receive the third voltage, and a drain configured to output a output signal; and
a second transistor comprising a gate configured to receive the first control signal, a source configured to receive the second voltage, and a drain connected to the drain of the first transistor and configured to output the output signal.

8. A memory device comprising:
bitcell circuitry comprising bitcells, wordlines, and bitlines, wherein each bitcell is connected to one of the wordlines and one or more of the bitlines; and
driver circuitry comprising:
first transistors configured to drive a first bitcell of the bitcells via a first bitline of the bitlines; and
a first inverter device coupled to the first transistors and configured to drive the first transistors with a first control signal, wherein the first inverter device comprises:
first inverter circuitry configured to receive a first signal, a first voltage, and a second voltage differing from the first voltage, and generate a first inverted signal based on the first signal, the first voltage and the second voltage; and
second inverter circuitry configured to receive the first inverted signal, the second voltage, and a third voltage differing from the second voltage, and generate the first control signal based on the first inverted signal, the third voltage and the second voltage, wherein a voltage value of the third voltage is greater than a voltage value of the second voltage.

9. The memory device of claim 8, wherein the second inverter circuitry comprises:
a first transistor comprising a gate configured to receive the first inverted signal, a source configured to receive the third voltage, a drain configured to output the first control signal; and
a second transistor comprising a gate configured to receive the first inverted signal, a drain connected to the drain of the first transistor and configured to output the first control signal, and a source configured to receive the second voltage.

10. The memory device of claim 8, wherein the driver circuitry further comprises:
second transistors configured to drive the first bitcell; and
a second inverter device coupled to the second transistors and configured to drive the second transistors with a second control signal generated based on a second signal.

11. The memory device of claim 10, wherein the second inverter device comprises:
third inverter circuitry configured to receive the second signal, the first voltage and the second voltage, and generate a second inverted signal based on the second signal, the first voltage and the second voltage; and
fourth inverter circuitry configured to receive the second inverted signal, the third voltage, and the second voltage, and generate the second control signal based on the second inverted signal, the third voltage and the second voltage.

12. The memory device of claim 11, wherein the fourth inverter circuitry comprises:
a third transistor comprising a gate configured to receive the second inverted signal, a source configured to receive the third voltage, and a drain configured to output the second control signal; and
a fourth transistor comprising a gate configured to receive the second inverted signal, a drain connected the drain of the third transistor and configured to output the second control signal, and a source configured to receive the second voltage.

13. The memory device of claim 12, wherein the first control signal is maintained at a logic value of zero based on the first signal having a logic value of zero.

14. The memory device of claim 8, wherein the first transistors comprise:
a first transistor comprising a gate configured to receive the first control signal, a source configured to receive the third voltage, and a drain configured to output a output signal; and
a second transistor comprising a gate configured to receive the first control signal, a source configured to receive the second voltage, and a drain connected to the drain of the first transistor and configured to output the output signal.

15. A driver circuitry comprising:
a first inverter device coupled to first transistors, and configured to drive the first transistors with a first control signal, the first inverter device comprises:
first inverter circuitry configured generate a first inverted signal based on a first signal, a first voltage and a second voltage differing from the first voltage; and
second inverter circuitry configured to generate the first control signal based on the first inverted signal, the second voltage and a third voltage differing from the second voltage, wherein the first transistors are configured to drive a first bitcell of a memory device based on the first control signal, and wherein a voltage value of the third voltage is greater than a voltage value of the second voltage; and
a second inverter device coupled to second transistors and configured to drive the second transistors with a second control signal generated based on a second signal, the second inverter device comprising:
third inverter circuitry configured to generate a second inverted signal based on the second signal, the first voltage and the second voltage; and
fourth inverter circuitry configured to generate the second control signal based on the second inverted signal, the third voltage and the second voltage, wherein the second transistors are configured to drive the first bitcell based on the second control signal.

16. The driver circuitry of claim 15, wherein the second inverter circuitry comprises:
a first transistor comprising a gate configured to receive the first inverted signal, a source configured to receive the third voltage, a drain configured to output the first control signal; and
a second transistor comprising a gate configured to receive the first inverted signal, a drain connected to the drain of the first transistor and configured to output the first control signal, and a source configured to receive the second voltage.

17. The driver circuitry of claim 15, wherein the fourth inverter circuitry comprises:
   a third transistor comprising a gate configured to receive the second inverted signal, a source configured to receive the third voltage, and a drain configured to output the second control signal; and
   a fourth transistor comprising a gate configured to receive the second inverted signal, a drain connected the drain of the third transistor and configured to output the second control signal, and a source configured to receive the second voltage.

* * * * *